United States Patent
Jahns et al.

(10) Patent No.: US 9,810,749 B2
(45) Date of Patent: Nov. 7, 2017

(54) MAGNETIC FIELD MEASURING DEVICE WITH VIBRATION COMPENSATION

(71) Applicant: Christian-Albrechts-Universitaet zu Kiel, Kiel (DE)

(72) Inventors: Robert Jahns, Kiel (DE); Holger Runkowske, Probsteierhagen (DE); Reinhard Knoechel, Elmshorn (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 0 days.

(21) Appl. No.: 14/894,407

(22) PCT Filed: May 27, 2014

(86) PCT No.: PCT/DE2014/100181
§ 371 (c)(1),
(2) Date: Nov. 27, 2015

(87) PCT Pub. No.: WO2014/194887
PCT Pub. Date: Dec. 11, 2014

(65) Prior Publication Data
US 2016/0116552 A1   Apr. 28, 2016

(30) Foreign Application Priority Data

Jun. 6, 2013 (EP) .................................... 13170893

(51) Int. Cl.
| | | |
|---|---|---|
| *G01R 33/00* | (2006.01) | |
| *G01R 33/02* | (2006.01) | |
| *G01R 33/06* | (2006.01) | |
| *G01R 33/18* | (2006.01) | |
| *G01L 1/12* | (2006.01) | |
| *G01B 7/14* | (2006.01) | |
| *G01B 7/30* | (2006.01) | |
| *B81B 3/00* | (2006.01) | |

(52) U.S. Cl.
CPC ............ *G01R 33/18* (2013.01); *B81B 3/0021* (2013.01); *G01R 33/0005* (2013.01); *G01R 33/0029* (2013.01); *G01R 33/0082* (2013.01); *G01R 33/06* (2013.01)

(58) Field of Classification Search
CPC ........ G01R 33/00; G01R 33/02; G01R 33/06; G01R 33/18; G01L 1/12; G01B 7/14; G01B 7/30
USPC .................................................. 324/244, 249
See application file for complete search history.

(56) References Cited

U.S. PATENT DOCUMENTS

| | | | | |
|---|---|---|---|---|
| 2009/0062886 A1* | 3/2009 | O'Handley | .......... | A61N 1/3787 607/51 |
| 2011/0062956 A1* | 3/2011 | Edelstein | ........... | G01R 33/0286 324/251 |
| 2014/0298916 A1* | 10/2014 | Duan | ....................... | G01L 1/12 73/779 |

OTHER PUBLICATIONS

International Search Report in International Application No. PCT/DE2014/100156, dated Aug. 5, 2014.

(Continued)

*Primary Examiner* — Arleen M Vazquez
*Assistant Examiner* — Neel Shah
(74) *Attorney, Agent, or Firm* — Patent Central LLC; Stephan A. Pendorf

(57) ABSTRACT

A magnetic field measuring device with a holding body and a plurality of magnetoelectric cantilever sensors, each of which is designed to output one electrical voltage signal while it bends in the presence of a magnetic field, the cantilever sensors being non-positively connected or bonded to the holding body.

10 Claims, 3 Drawing Sheets

(56) References Cited

OTHER PUBLICATIONS

Figure 1:
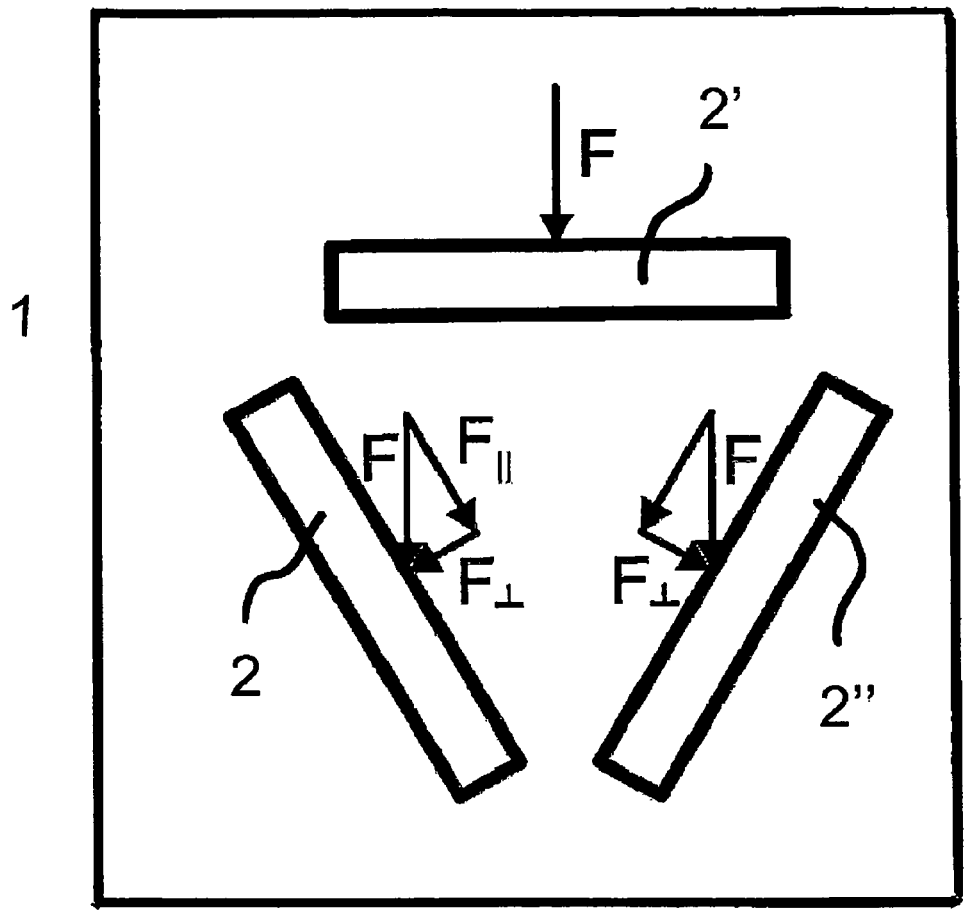

Stephan Marauska et al. "Paper; MEMS magnetic field sensor based on magnetoelectric composites; MEMS magnetic field sensor based on magnetoelectric composites", Journal of Micromechanics & Microengineering, Institute of Physics Publishing, Bristol, GB, vol. 22, No. 6, May 22, 2012 (May 22, 2012), pp. 1-6, XP020224204,ISSN: 0960-1317, DOI:10.1088/0960-1317/22/6/065024, abstract; figure 1.

Zengping Xing et al. "Investigation of external noise and its rejection in magnetoelectric sensor design", Journal of Applied Physics, American Institute of Physics. New York, US, vol. 106, No. 2, Jul. 28, 2009 (Jul. 28, 2009), pp. 24512-1 to 24512-7, XP012123655, ISSN: 0021-8979, DOI: 10.1063/1.3176500.

\* cited by examiner

MAGNETIC FIELD MEASURING DEVICE WITH VIBRATION COMPENSATION

The invention relates to a magnetic-field measurement device comprising a plurality of magneto-electric sensors.

Magnetoelectric sensors, ME sensors for short, are suitable a. o. for detecting small magnetic fields that vary over time, as they are produced for example by biological action currents in living organisms, e.g. human brain waves. ME sensors are a possible key technology for developing biomagnetic interfaces that may be applied initially in medical diagnostics, e.g. MEG, MCG, and possibly also in prosthesis control or generally in human-machine-interaction. The functional principle of today's ME sensors lies in the mechanical force coupling of magnetostrictive and piezoelectric materials in a composite material.

Magnetostrictive materials, e.g. ferromagnetic transition metals Fe, Ni, Co and their alloys, compositions of the rare earths Tb, Dy, Sm with the ferromagnetic transition metals, e.g. $TbFe_2$, $SmFe_2$ are also ferromagnetic glasses predominantly containing the elements iron, cobalt, boron or silicon in varying fractions, experience a reversible change in length along the direction of a magnetic field acting on them. When a magnetostrictive material is bonded adhesively/cohesively to a piezoelectric, e.g. lead zirconate titanate PZT, polyvinylidene fluoride PVDF, aluminum nitride AlN, the magnetostrictive change in length at the same time results in a force on the piezoelectric, there leading to a structural charge displacement and entailing a measurable piezo voltage. This voltage can be detected electronically as a measure for the magnetic field strength and evaluated.

Among the simplest embodiments of an ME sensor is a so-called bending-beam sensor. It exhibits—often on a glass substrate or on a semiconductor substrate—a sequence of different material layers, at least one layer consisting of a magnetostrictive material and at least one further layer of a piezoelectric. In the conventional construction, additional electrodes are arranged above and below the piezoelectric layer for tapping the piezo voltage when the piezo layer that is usually poled at right angles to the layer sequence is deformed. Magnetostrictive materials are usually metallically conducting and are contacted directly to the piezoelectric to serve directly as one of the electrodes. Other design versions for the ME bending-beam sensors are also known.

An ME bending-beam sensor usually exhibits the shape of a rectangular strip. The direction along which the magnetostrictive material exhibits its largest change in length relative to small magnetic fields can be set among others by a temperature treatment in the pre-known magnetic field—"magnetic field annealing"—during the manufacture of the sensor. This direction is usually made to coincide with the long axis of the strips. Under the action of a magnetic field along the long axis, the strip then deflects due to the differing expansion of material even in the case of small magnetic-field amounts and thus generates a measurable signal voltage.

Magnetostrictive and piezoelectric materials can be deposited one on top of the other and/or on predetermined substrates using known coating technologies. To this extent, the manufacture of ME sensors is compatible to processes of silicon technology; in particular integrated ME sensors can be manufactured for example in MEMS design—Micro Electrical Mechanical Systems. The separate production of magnetostrictive and piezoelectric films and the subsequent bonding of both to form an ME film are also suitable for creating magnetic-field sensors according to the principle described.

ME sensors are mechanical oscillators. Under the action of a periodic magnetic field having a defined frequency they show an enforced mechanical oscillation behavior. If the excitation here takes places using the mechanical resonant frequency of the ME sensor, then even very small magnetic-field strengths result in very large measurement voltages.

Biologically generated magnetic fields typically only exhibit frequencies of the order of magnitude of 1 Hz up to approximately 100 Hz. In contrast thereto, the resonant frequencies of well-established ME sensors usually amount to a few 100 Hz up to a few 100 kHz. The ratio of the electrical-field strength amplitude induced in the ME sensor to the exciting magnetic-field strength amplitude is designated as the ME coefficient $\alpha_{ME}$. The ME coefficient typically varies by two to three orders of magnitude between measurements of magnetic fields in the resonant case and far outside the resonance.

ME sensors are usually also operated outside their mechanical resonance. Since the largest possible measurement dynamics, the largest possible signal noise ratio, and the linearity of the voltage response to the magnetic field to be measured are of interest, usually an operating point for the ME sensor is selected in the linear range of the magnetostriction characteristic.

The magnetostriction characteristic describes the linear expansion of a magnetostrictive material along a predetermined direction when it is exposed to a magnetic-field strength having the amount H. Here, a sign change of H corresponds to a reversal of the magnetic field, and since both field directions have the same effect on the material, the magnetostriction characteristic is as a matter of principle symmetrical to H=0. The magnetostriction characteristic shows a parabolic curve about H=0, but is limited in the event of high field strengths in that at some point all magnetic domains are aligned identically. Consequently, they have two inflection points at $\pm H_B$, where it runs approximately linear and exhibits the largest gradients.

To operate the ME sensor in this advantageous operating point, in many cases a constant bias magnetic field having the field strength $H_B$ is applied by suitably arranging current conductors or permanent magnets.

ME sensors are subject to internal and external disturbances, among others thermal fluctuations of the electronic material properties and unwantedly transmitted mechanical vibrations by air-borne or structure-borne noise. Precision measurements therefore often require the installation of the ME sensor in a measurement chamber in which the temperature is stabilized and that can even be evacuated. Notwithstanding, vibrations of the measurement chamber in the laboratory mostly cannot be excluded so that disturbances can still be introduced into the measurement signal even across a mechanically dampened holder of the ME sensor. In general, use of such a measurement chamber is no option for many measurement tasks in practice.

The work by Xing Zengping et al., "Investigation of external noise and its rejection in magnetoelectric sensor design", J. Appl. Phys. 106, 024512 (2009) therefore investigates how ME sensors could be designed so that they suppress disturbances on account of their design or separate them from the useful signal of the sensor. The work reveals among others the easily understood finding, "that vibrational acoustic noise sources can be cancelled, if the structure of the sensor is designed to be mechanically symmetrical" (section II A). The authors then also draw the conclusion that a unimorph that corresponds to the bending-beam sensor described above does not exhibit any capability for vibration suppression or separation on account of its asymmetric construction (section III A, see also table 19). The predominant part of the work rather discusses symmetrical ME sensors having a sandwich construction that can be developed in a targeted manner.

In addition to ME sensors, also tuning-fork sensors are known for magnetic-field measurement. The functional principle is to excite a mechanical oscillator—usually in the shape of a tuning fork having tines—to oscillate close to its resonant frequency, to monitor the parameters of the oscillation—frequency, phase, amplitude—and to draw conclusions as to a magnetic field that is present from changes of these parameters. For example arranging permanent magnets at the tines of the tuning fork, as is suggested in the printed publication US 2007/0296410 A1, causes a magnetic field to exert a force on the oscillating tines and change the parameters of the oscillation. Sensors according to the same principle are also to be realized in MEMS design. In addition, it was already proposed to coat the tines with a magnetostrictive material to influence the oscillation as a function of a magnetic field.

The work by Marauska et al., "MEMS magnetic field sensor based on magnetoelectric composites", J. Micromech. Microengin., Vol. 22, 2012, p. 65024 ff. deals with the issue how miniaturized ME bending beams—possibly also arrays—could be produced efficiently and reliably using MEMS design, that is using the methods for component mass production that are common in industry. The starting point is a planar substrate, e.g. a silicon wafer, from which free-standing "cantilever beams" are worked out by means of etching processes which are then upgraded to ME bending beams by coatings. Marauska et al. recognize the problem of the disturbance by vibration that they counter by providing vibration dampers on the measurement chamber (section 2.2).

However, further possibilities for vibration compensation do not result from the synopsis with the work by Xing Zengping et al. (2009). This is because the cantilever beams by Marauska et al. are provided as supports, arranged in parallel and connected to the wafer, of thin films that in turn can only be applied from one side. Thus only ME bending-beam sensors can be produced that deflect more or less strongly under the effect of a magnetic field. The behavior of each of the ME sensor strips thus corresponds to that of a unimorph, to which Xing Zengping et al. expressly do not ascribe any intrinsic capability for vibration compensation.

The ME bending-beam sensor described at the beginning is fascinating on account of its simple and cost-effective manufacturability and seems particularly suited in particular for biomagnetic field measurements.

It is therefore the object of the invention to propose a magnetic-field measurement device on the basis of ME bending-beam sensors that exhibits a capability, on account of its construction, for vibration compensation and is therefore largely insensitive against the introduction of mechanical oscillations by air-borne or structure-borne noise.

The objective is achieved by a magnetic-field measurement device comprising a holding body and a plurality of magnetoelectric bending-beam sensors individually designed for outputting in each case one electric voltage signal while deflecting in the presence of a magnetic field, the bending-beam sensors being bonded to the holding body by force closure or adhesively/cohesively, characterized in that a. the bending-beam sensors are arranged with parallel-extending long axes for the detection of the same magnetic field, so that b. the magnetic-field measurement device is excitable to a mechanical oscillation by a temporally periodic magnetic field, that c. develops in such a way that the magnetic-field measurement device exhibits at least one force node on which at no time a resulting force acts that is caused by the oscillation, and d. the magnetic-field measurement device outputs a linear combination of the voltage signals of the bending-beam sensors.

The finding that is revealed in the work by Xing Zengping et al. (2009) that symmetrically constructed ME magnetic-field sensors permit vibration compensation is taken up by the invention and developed further in a new direction.

The approach of the invention consists in arranging a plurality of bending-beam sensors on a joint holding body in such a way that on the one hand all bending beams measure the same magnetic field and on the other hand the introductions of vibrations into the entire arrangement generate disturbance signals in all bending beams that cancel each other out as a result of a linear combination of all output voltages of the bending beams.

Here the holding body is a rigid body that enables mechanically coupling the oscillations of all bending beams. The holding body can consist of a semiconductor, a metal, a plastic, e.g. polymethyl methacrylate PMMA or also from a glass. It preferably exhibits an N-fold symmetry axis, N being a natural number larger than one. The holding body can also have the shape of a cylinder ($N \rightarrow \infty$).

The bending beams and the holding body together are to be able to oscillate mechanically under the effect of a temporally periodic magnetic field. For this purpose, the bending beams are bonded to the holding body adhesively/cohesively or by force closure, for example glued, soldered, sintered or fastened using clamps. The strip-shaped bending beams are preferably in each case connected to the holding body at a strip end.

The entirety of the arrangement of the bending beams, the holding body and the circuitry of the bending-beam voltage outputs for forming the suitable linear combination of the voltage signals represents—possibly in a constructional unit—the inventive magnetic-field measurement device. This device can be made to oscillate mechanically by means of a temporally periodic magnetic field alone. According to the invention, during this oscillation there exists at least one point of the device that at no point in time is made to move, since at no point in time a resulting force caused by the oscillation acts on it. Here such a point is called a force node.

However, the force node is made to move by vibrations that are introduced into the magnetic-field measurement device from outside by air-borne or structure-borne noise. The arrangement of the bending-beam sensors then detects in each bending beam in addition to the magnetic field to be measured a vibration-induced disturbance. The generated voltage signals cannot be separated according to causes for the individual bending beams. The invention now teaches that a linear combination of the voltage signals can be formed in which the components of the vibration disturbance compensate each other if the bending beams are arranged such that the device exhibits at least one point that stays at rest at any time in the presence of a temporally periodic magnetic field and in the absence of a vibration during the oscillation caused by the magnetic field.

Figure 2:
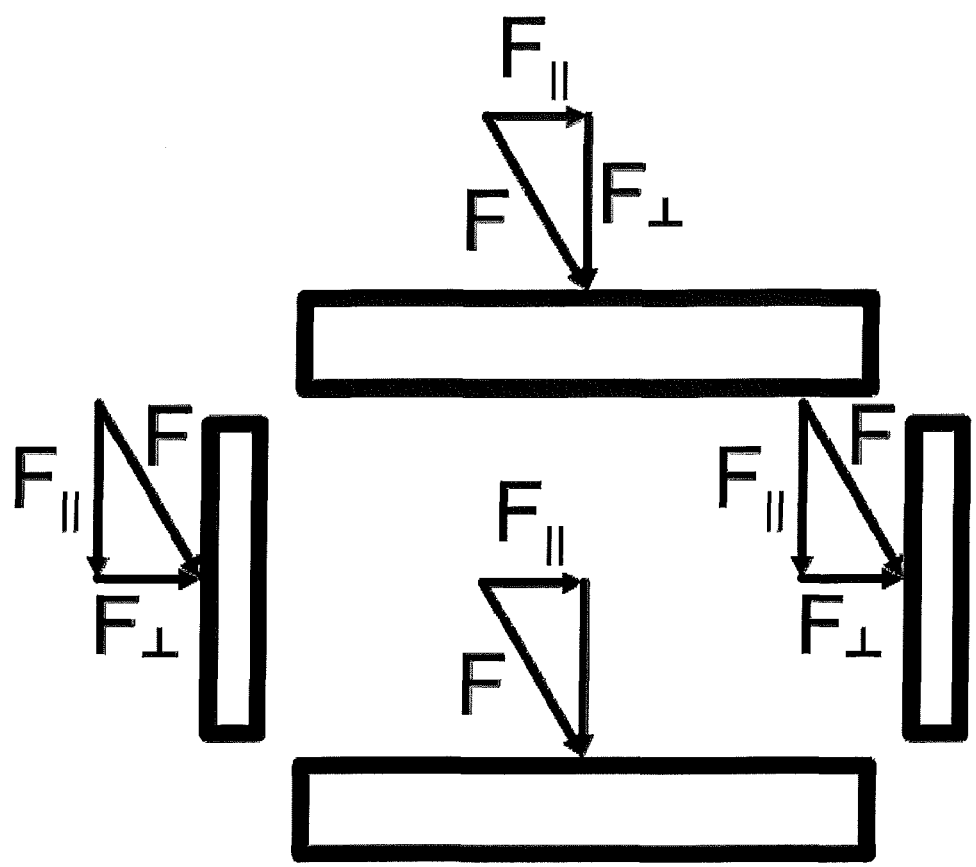
Figure 3:
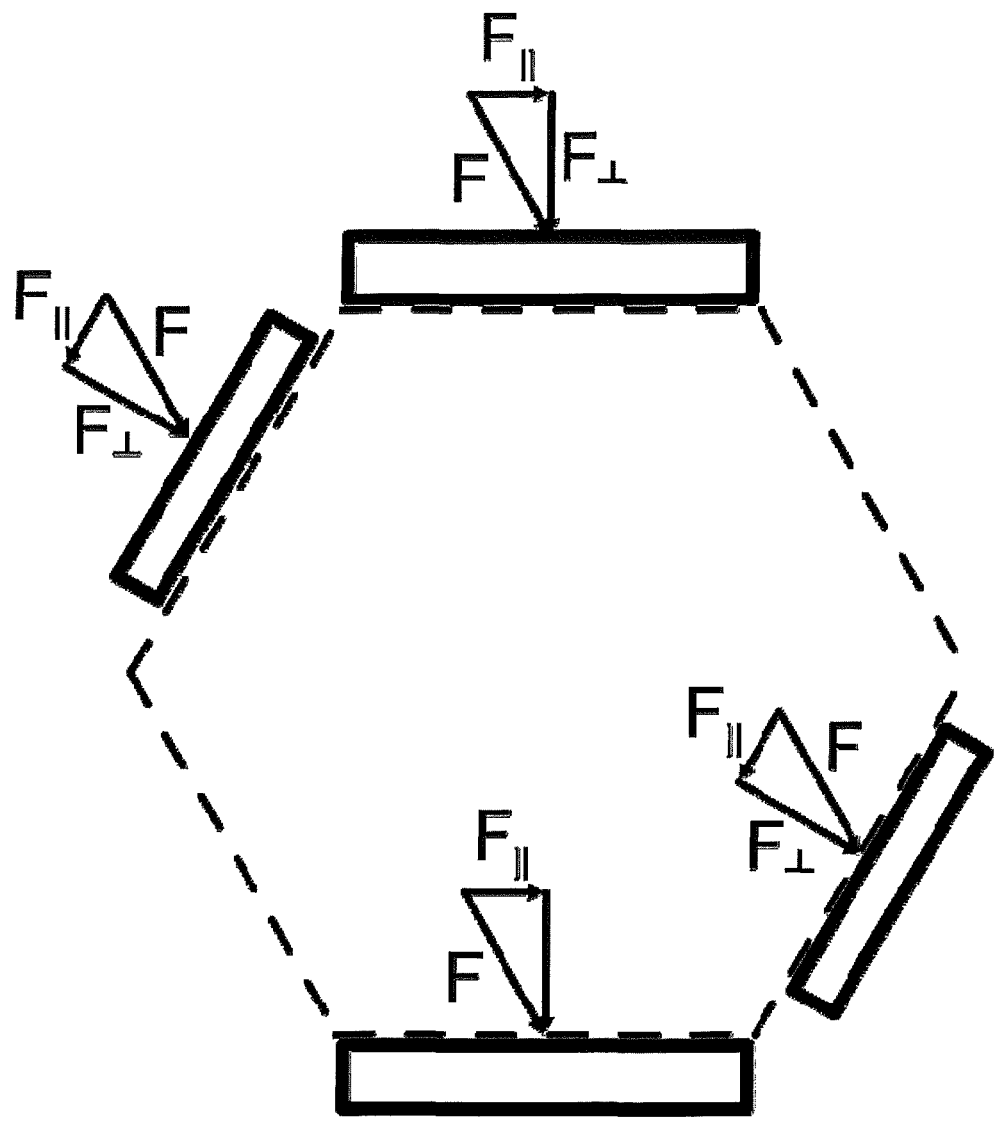

The invention is explained in more detail below also using examples and drawings. In the drawings:

FIG. 1 illustrates a diagram of a cross section through an arrangement of three similar ME bending-beam sensors (rectangles) with forces that act on the arrangement due to a vibration disturbance;

FIG. 2 illustrates a diagram of a cross section through an arrangement of four ME bending-beam sensors (rectangles) comprising two pairs of pair-wise similar sensors, fastened to a cube or cuboid-shaped holding body, and FIG. 3 illustrates a diagram of a cross section through an arrangement of four ME bending-beam sensors (rectangles) comprising two pairs of pair-wise similar sensors, fastened to a hexagonal holding body.

For the further description, initially a few explanations of terms are convenient:

An ME bending-beam sensor in strip-shape exhibits a first and a second flat side. The sensors are usually manufactured such that both flat sides are of equal length in the absence of a magnetic field to be measured, i.e. the strip is straight.

In this description, it is here always assumed that the ME bending-beam sensor a priori is always located in an advantageous operating point for magnetic-field measurement. As explained further above, this can take place by arranging permanent magnets that generate a constant bias field along the long axis of the bending beam. However, it is also known to design bending beams as layer systems having at least one anti-ferromagnetic layer that achieves such an operating point by means of pinning the elementary dipoles by exchange bias. Such a design exhibits only a very weak, construction-related temporally constant magnetic field in comparison to the conventional bias magnetic field. Irrespective of how precisely the operating point is set, it is from now on presupposed that it is positioned in the linear range of the magnetostriction characteristic of the magnetostrictive layer of the bending beam. In the further description, construction-related, temporally constant magnetic fields, in particular bias magnetic fields, that establish the operating point of the ME bending beam, will no longer be addressed explicitly.

If a magnetic field to be measured having a predetermined direction exists along the long axis of the bending beam, the length of at least one of the two flat sides changes and the bending beam deflects. In the following text, that flat side is designed as the upper side of the strip that is longer in the state in which it is bent by a magnetic field having a predetermined direction. Accordingly, the opposite shorter flat side will from now on be called the lower side. In the following text, the designations upper and lower side of all ME bending beams of an arrangement always refer to the same predetermined magnetic-field direction. Here this is without any problems since in the inventive magnetic-field measurement device all bending beams are always arranged in such a way that their long axes extend in parallel.

For the purpose of the invention it is advantageous, in the ideal case to bring structurally identical ME bending-beam sensors into the inventive arrangement. However, the structural identity is a strong requirement that for practical reasons cannot always be met. For the invention it is sufficient if bending-beam sensors are used that exhibit approximately the same mass and length and show the same deflection and output the same voltage signal when a magnetic field acts.

For example, bending-beam sensors can be manufactured that do not differ in terms of the substrates, e.g. silicon strips, the functional materials, e.g. metglass and PZT and all dimensions—lengths, layer thicknesses, layer arrangement—, but exhibit different electrode materials, e.g. gold or platinum, for tapping the voltage. The electrode layers having a thickness of a few nanometers do not play any role for the mechanical behavior of the bending beam and the voltage signal of the ME sensor. These sensors are not structurally identical but in any case cannot be distinguished from each other solely by their mechanical or electrical response to a magnetic field. In the context of the further description, sensors having this attribute are described as similar.

For a better understanding the invention, at first a very simple exemplary embodiment is described.

Two similar bending-beam sensors are arranged on two opposite flat sides of a cuboid-shaped holding body. Both bending-beam sensors are fastened to the holding body with in each case one of their beam ends with a clamp by pressing against their lower sides and their long axes point in the same direction. The bending beams are located precisely opposite with lower sides pointing to each other with a distance that is determined by the dimensions of the holding body. This distance is to be small but not that small that the bending beams could contact each other during deflection. Purely optically, this embodiment looks similar to a tuning fork whose tines are formed by the bending beams. The design can oscillate mechanically. It exhibits a two-fold rotational axis of symmetry, i.e. running parallel to the long axes of the bending beams through the center point of the holding body.

A temporally periodic magnetic field that is simultaneously detected by both bending beams now causes the deflection of the bending beams toward each other and—when the field direction is reversed—away from each other. The structure carries out an enforced mechanical oscillation at the period of the magnetic field, that is, not necessarily at the resonant frequency of the structure that can be considerably higher. This is no variation of a tuning-fork sensor that is known per se.

Nonetheless, an oscillation movement takes place that is comparable to the known tuning-fork oscillation. In particular there exists at least one point of the device that is at a force equilibrium at every point in time, thus experiencing no resulting force from the oscillation and remaining at rest: a force node that is located here on the rotational axis of symmetry in the holding body.

During the oscillation, both bending beams generate a voltage signal that in the case of similar sensors—within the error margins caused by measurement inaccuracies—is of identical magnitude in terms of absolute value and sign at every point in time. When both signals are added, double the ME sensor voltage is obtained for an existing magnetic field in the absence of a disturbing vibration.

If now additionally a vibration by air-borne or structure-borne noise occurs during the measurement of the magnetic field, this disturbance causes a further—usually itself time-dependent—force action at every point of the device. As a result of this, the relatively movable bending beams experience additional deflections when a force component acts at right angles to the flat sides of the bending beams. However, this force component at both bending beams always points in the same direction, i.e. in the case of one bending beam, the deflection becomes stronger and with the other one weaker at the same time. The influence of the vibration on the voltage signals of the bending beams is to that extent counter-phase at any time, and indeed adding the two signals shows that the vibration in the sum signal is compensated.

The linear combination, mentioned initially, of the voltage signals of the bending beams is thus exemplary and prefers the addition.

The same is valid for the second exemplary embodiment that is also sketched in FIG. 1. The holding body (not shown) can for example be here a block from PMMA having flat sidewalls and a 3N-fold rotational axis of symmetry, N being a natural number. Three similar ME bending beams are arranged on three sidewalls of the holding body that can be mutually converted into each other, and bonded thereto e.g. using an epoxy resin. As previously, the long axes of the bending beams point parallel in the same direction that at the same time is the measurement field direction for the magnetic field and the direction of the rotational axis of symmetry. In FIG. 1, the arrangement of the bending beams is indicated by a cross section at right angles to the long axes, it being intended that each rectangle represents a cross section through a bending beam. Here, too, in exemplary manner the lower sides of all bending beams face the rotational axis of symmetry, that is toward the inside of the arrangement. Consequently, all bending beams deflect in the same manner inward under the action of a magnetic field, that is toward the rotational axis of symmetry, or outward during field inversion. All bending beams are to detect the same field and therefore output the identical voltage signals whose sum is then the three-fold ME sensor voltage of a single bending beam.

FIG. 1 furthermore illustrates an externally acting force F as a vector arrow. Just for the purpose of clarification, in the diagram it is directed at right angles to the flat side of one of the bending beams and deflects the latter toward the rotational axis of symmetry of the device. However, each of the two other bending beams experiences a deflection away from the rotational axis of symmetry, to be specific only by the component of F, acting at right angles on the respective bending beam, that in each case just exhibits half the amount of F. Here, too, the force F effects disturbing components in the voltage signals of all three bending-beam sensors, and as previously, precisely these disturbance components cancel each other when the three voltages are added. If the force acts from another direction than illustrated in FIG. 1, it can be broken down into its components parallel and at right angles to one of the bending beams, and the arguments above likewise are valid for the components. The influence of a vibration is compensated by the arrangement of the similar bending beams and the fact that the holding body provides for rotationally-symmetrical identical mechanical conditions everywhere.

After what has been said above, the person skilled in the art readily recognizes that further developments of an inventive magnetic-field measurement device can be designed very easily, the holding body exhibits an N-fold rotational symmetry relative to an axis of symmetry and M similar bending-beam sensors are arranged with their long axes parallel to the axis of symmetry and connected to the holding body such that a magnetic-field measurement device exhibits an M-fold rotational symmetry relative to the axis of symmetry, N being a natural number larger than one and M being a divisor of N and larger than one.

In the first exemplary embodiment N=M=2. For the second exemplary embodiment, it is also possible to use N=M=3, but likewise also N=6 and M=3.

As a third exemplary embodiment, again a cuboid is to be presented as holding body that exhibits a two-fold rotational axis of symmetry and two pairs of identical flat sidewalls that can be transformed into each other by rotation. It is now sufficient to arrange a pair of similar ME bending-beam sensors—with their lower side pointing toward the rotational axis of symmetry as before—on a pair of identical sidewalls, thus arriving at the first exemplary embodiment. In addition, the second pair of identical sidewalls can likewise be provided with a second pair of similar bending beams, in no way it being necessary that also the sensors of the first and the second pair are similar. For example a pair of longer and a pair of shorter bending beams can be used. As before, the vibration compensation results from the symmetry of the structure, and here again the sum of all voltage signals of the bending-beam sensors is vibration-compensated. A cross sectional diagram of the arrangement is illustrated in FIG. 2, there also being illustrated an externally acting force F and at each bending beam a force resolution into components that act at right angles and in parallel.

The fourth and last exemplary embodiment relates to a hexagonal holding body, i.e. having a six-fold rotational symmetry and six identical sidewalls. Depending on the choice of the user, one, two or three pairs of bending beams can be arranged on these. Here, too, pairs of bending-beam sensors are similar, each pair occupying two opposite sidewalls of the holding body. For example FIG. 3 shows hatched the cross section of the holding body, a first pair of similar bending beams (rectangles) in the 6 o'clock and 12 o'clock position, a second pair of similar bending beams in the 4 o'clock and 10 o'clock position and the externally acting disturbing forces analogous to FIG. 2. Apart from that, the sensor pairs can differ from each other and exhibit in particular different materials, dimensions and in particular also resonant frequencies. Magnetic-field measurement devices in this construction resemble the ME sensor arrays known per se that among others can be used for sensitively detecting temporally periodic magnetic fields having a complex or changeable frequency spectrum. The inventive characteristic is here that the holding body exhibits a 2N-fold rotational symmetry relative to an axis of symmetry and M pairs of pair-wise similar bending-beam sensors are arranged with their long axes parallel to the axis of symmetry and are connected to the holding body such that the magnetic-field measurement device exhibits a two-fold rotational symmetry relative to the axis of symmetry, N and M being natural numbers.

For clarification, let it once again be expressly said that for the previously mentioned exemplary embodiments a rotational symmetry of the magnetic-field measurement device is mentioned that not only describes the holding body and the geometric arrangement of the bending beams on the holding body, but also comprises the orientation of these bending beams relative to the axis of rotation. The lower sides of the bending beams in the arrangement can be chosen facing toward or away from the axis of rotation, but always such that similar bending beams are oriented symmetrically and deflect—if necessary, at least in pairs—synchronously toward the axis of rotation or away from it in the presence of a detectable magnetic field. The mechanical coupling of the bending beams that is introduced by the holding body then enables the symmetrical mechanical conditions to be maintained as long as the magnetic-field measurement device carries out an oscillation only due to a temporally periodic magnetic field.

If in addition a disturbance of the magnetic-field measurement device occurs by the introduction of a vibration via air-borne or structure-borne noise, the symmetry of the motion, that is generated due to the construction is disturbed and each bending beam senses a component of the disturbance and outputs a disturbed voltage signal. However, as explained above, the disturbing components cancel each other in the sum of the signals in the case of similar bending beams. In case not all bending beams that are used are similar, as in the last two exemplary embodiments, it can then be convenient to place differing weights on the voltage signals of different bending beam pairs also in the formation of the sum. In a generalized manner, we therefore here speak of the formation of a linear combination of all voltage signals of the bending beams as an output of the inventive magnetic-field measurement device.

As the exemplary embodiments show, the concept on which the invention is based cannot be completely and comprehensively described alone with the provision of an N-fold rotational axis of symmetry for the vibration-compensated magnetic-field measurement device, since this is a sufficient, but not a necessary criterion. What is essential, is moreover the presence of a mechanical symmetry that is ensured continuously even during the oscillation of the magnetic-field measurement device when this oscillation only originates from the detected magnetic field. Therefore the existence of at least one point in the device that does not move at any time even during such an oscillation is therefore regarded as a recognizable indicator of an inventive magnetic-field measurement device. Such a point has to be force-free continuously and is therefore labeled here as a force node.

Gravitation of course always acts on each point of the device. For immobilizing the attitude, the device is to be connected to a suitable stand at at least one attachment point. The stand can be a linkage or also the housing of a measurement chamber, in each case the stand is a conductor for structure-borne noise. The fastening point of the magnetic-field measurement device itself becomes the point of introduction for structure-borne noise into the sensor as a result of the connection to the stand. It is particularly advantageous to choose this fastening point, if possible, in the vicinity of a force node and on top of this to suppress the transmission of structure-borne noise from the stand by providing a noise-damping connection such as e.g. by elastic claw cushions in a clamping connection.

The invention claimed is:

1. A magnetic-field measurement device comprising
a holding body (1) and
a plurality of magnetoelectric bending-beam sensors (2, 2', 2") individually designed for outputting respectively one electric voltage signal while deflecting in the presence of a magnetic field, the bending-beam sensors being bonded to the holding body by force closure or adhesively/cohesively, wherein
a. the bending-beam sensors (2, 2', 2") are arranged with parallel-extending long axes for the detection of the magnetic field, and wherein
b. the magnetic-field measurement device is excitable to a mechanical oscillation when the magnetic field is a temporally periodic magnetic field, wherein it
c. develops in such a way that the magnetic-field measurement device exhibits at least one force node (F) on which at no time a resulting force acts that is caused by the oscillation,
d. the magnetic-field measurement device outputs a linear combination of the voltage signals of the bending-beam sensors, and
e. the introductions of vibrations into the entire arrangement by air-borne or structure-borne noise generate disturbance signals in all bending beams that cancel each other out as a result of a linear combination of all output voltages of the bending beams.

2. The magnetic-field measurement device according to claim 1, wherein the holding body exhibits an N-fold rotational symmetry relative to an axis of symmetry and M similar bending-beam sensors are arranged with their long axes parallel to the axis of symmetry and connected to the holding body such that a magnetic-field measurement device exhibits an M-fold rotational symmetry relative to the axis of symmetry, N being a natural number larger than one and M being a divisor of N and larger than one.

3. The magnetic-field measurement device according to claim 2, wherein the magnetic-field measurement device outputs the sum of all voltage signals of the bending-beam sensors.

4. The magnetic-field measurement device according to claim 1, wherein the holding body exhibits a 2N-fold rotational symmetry relative to an axis of symmetry and M pairs of pair-wise similar bending-beam sensors are arranged with their long axes parallel to the axis of symmetry and are connected to the holding body such that the magnetic-field measurement device exhibits a two-fold rotational symmetry relative to the axis of symmetry, N and M being natural numbers.

5. The magnetic-field measurement device according to claim 4, wherein the magnetic-field measurement device outputs the sum of all voltage signals of the bending-beam sensors.

6. The magnetic-field measurement device according to claim 1, wherein the magnetic-field measurement device outputs the sum of all voltage signals of the bending-beam sensors.

7. The magnetic-field measurement device according to claim 6, wherein the magnetic-field measurement device outputs the sum of all voltage signals of the bending-beam sensors.

8. A magnetic-field measurement device comprising
a holding body (1),
a plurality of magnetoelectric bending-beam sensors (2, 2', 2") individually designed for outputting respectively one electric voltage signal while deflecting in the presence of a magnetic field, the bending-beam sensors being bonded to the holding body by force closure or adhesively/cohesively, and
a circuitry of the bending-beam voltage outputs for forming a linear combination of the voltage signals of the bending-beam sensors, wherein
the holding body is a rigid body that enables mechanically coupling the oscillations of all bending beams,
the magnetic-field measurement device is excitable to a mechanical oscillation when the magnetic field is a temporally periodic magnetic field, during which oscillation there exists at least one point of the device that at no point in time is made to move, since at no point in time a resulting force caused by the oscillation acts on it, this point being the force node,
the force node is made to move by vibrations that are introduced into the magnetic-field measurement device from outside by air-borne or structure-borne noise, the arrangement of the bending-beam sensors then detecting in each bending beam in addition to the magnetic field to be measured a vibration-induced disturbance, and
the plurality of bending-beam sensors are arranged on the holding body in such a way that
all bending beams measure the magnetic field, and
the introductions of vibrations into the entire arrangement by air-borne or structure-borne noise generate disturbance signals in all bending beams that cancel each other out as a result of a linear combination of all output voltages of the bending beams.

9. The magnetic-field measurement device according to claim 8, wherein the holding body exhibits an N-fold rotational symmetry relative to an axis of symmetry and M similar bending-beam sensors are arranged with their long axes parallel to the axis of symmetry and connected to the holding body such that a magnetic-field measurement device exhibits an M-fold rotational symmetry relative to the axis of symmetry, N being a natural number larger than one and M being a divisor of N and larger than one.

10. The magnetic-field measurement device according to claim 8, wherein the holding body exhibits a 2N-fold rotational symmetry relative to an axis of symmetry and M pairs of pair-wise similar bending-beam sensors are arranged with their long axes parallel to the axis of symmetry and are connected to the holding body such that the magnetic-field measurement device exhibits a two-fold rotational symmetry relative to the axis of symmetry, N and M being natural numbers.

* * * * *